(12) United States Patent
Harman et al.

(10) Patent No.: US 6,605,772 B2
(45) Date of Patent: *Aug. 12, 2003

(54) NANOSTRUCTURED THERMOELECTRIC MATERIALS AND DEVICES

(75) Inventors: Theodore C. Harman, Lexington, MA (US); Patrick J. Taylor, Woburn, MA (US); Michael P. Walsh, Lundenberg, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/864,835

(22) Filed: May 24, 2001

(65) Prior Publication Data

US 2002/0053359 A1 May 9, 2002

Related U.S. Application Data

(63) Continuation-in-part of application No. 09/648,584, filed on Aug. 25, 2000, now Pat. No. 6,444,896.
(60) Provisional application No. 60/207,759, filed on May 30, 2000, and provisional application No. 60/151,011, filed on Aug. 27, 1999.

(51) Int. Cl.$^7$ .......... H01L 35/12; H01L 35/28; H01L 35/30
(52) U.S. Cl. .......... 136/236.1; 136/203; 136/205; 257/15
(58) Field of Search .......... 136/203, 205, 136/236.1; 257/15

(56) References Cited

FOREIGN PATENT DOCUMENTS

WO   WO 98/44562   * 10/1998

* cited by examiner

*Primary Examiner*—Patrick Ryan
*Assistant Examiner*—Thomas H. Parsons
(74) *Attorney, Agent, or Firm*—Daly, Crowley & Mofford, LLP (57) ABSTRACT

Quantum-dot superlattice (QLSL) structures having improved thermoelectric properties are described. In one embodiment, PbSe$_x$Te$_{1-x}$/PbTe QDSLs are provided having enhanced values of Seebeck coefficient and thermoelectric figure of merit (ZT) relative to bulk values. The structures can be combined into multi-chip devices to provide additional thermoelectric performance.

7 Claims, 12 Drawing Sheets

NANOSTRUCTURED THERMOELECTRIC MATERIALS AND DEVICES

CROSS-REFERENCE TO RELATED APPLICATIONS

This application is a continuation-in-part of U.S. application Ser. No. 09/648,584 filed Aug. 25, 2000 (now U.S. Pat. No. 6,444,896) filed Sep. 3, 2002, which claims priority under 35 U.S.C. §119(e) to provisional patent application No. 60/151,011 filed Aug. 27, 1999. This application claims priority under 35 U.S.C. §119(e) to provisional patent application Ser. No. 60/207,759 filed May 30, 2000; the disclosure of which is hereby incorporated by reference.

This invention was made with government support under AF Contract No. F19628-95C-0002 awarded by the Department of the Navy, the Army Research Office, and the Defense Advanced Research Projects Agency (DARPA).

FIELD OF THE INVENTION

This invention relates generally to thermoelectric materials and more particularly to quantum dot superlattice structures.

BACKGROUND OF THE INVENTION

As is known in the art, there exists a class of materials referred to as thermoelectric materials. A thermoelectric material is a type of material which can directly convert thermal energy into electrical energy or vice versa.

Although certain thermoelectric materials have been known in the art for a number of years (e.g.—bulk semiconductors), it has only recently been found that thermoelectric materials having a superlattice structure can possess thermoelectric properties which are better than the corresponding thermoelectric properties of other thermoelectric materials.

A superlattice structure denotes a composite structure made of alternating ultrathin layers of different component materials. A superlattice structure typically has an energy band structure which is different than, but related to, the energy band structures of its component materials. The selection of the component materials of a superlattice structure, and the addition of relative amounts of those component materials, will primarily determine the resulting properties of a superlattice structure as well as whether, and by how much, those properties will differ from those of the superlattice structure's component material antecedents.

It is generally known that thermoelectric materials and thermoelectric materials having a superlattice structure find application in the fields of power generation systems, and the heating and/or cooling of materials. One problem, however, is that although these fields place ever-increasing demands on thermoelectric materials to possess ever-improving thermoelectric performance characteristics, the thermoelectric materials and thermoelectric materials having a superlattice structure known in the art have, as of yet, not been able to keep pace with such performance demands.

One way to predict the thermoelectric behavior of thermoelectric materials or thermoelectric materials having a superlattice structure in the fields of power generations systems, and the heating and/or cooling of materials is to calculate a thermoelectric figure of merit for the materials. The thermoelectric figure of merit, ZT, is a dimensionless material parameter in which T corresponds to temperature and Z is the figure of merit. ZT is a measure of the utility of a given thermoelectric material or thermoelectric materials having a superlattice structure in power generation systems, and heating and/or cooling applications at a temperature T.

The relationship of ZT to the material properties of thermoelectric materials and thermoelectric materials having a superlattice structure is shown by the following equation:

$$ZT = S^2 \sigma T/\kappa = S^2 n e \mu T/(\kappa_1 + \kappa_e) = P_F T/K = S^2 G T/K$$

in which S, $\sigma$, T and $\kappa$ are, respectively, the Seebeck coefficient, the electrical conductivity, the temperature, and the thermal conductivity and where n, e, $\mu$, $\kappa_1$ and $\kappa_e$ are, respectively, the carrier density, the electronic charge, the carrier mobility, the lattice part of the thermal conductivity and the electronic part of the thermal conductivity, and where $P_F$ is the power factor, and where G and K are, respectively, the electrical conductance and the thermal conductance.

Generally, it is known in the art that it is desirable for thermoelectric materials to have a relatively high value for their thermoelectric figure of merit (ZT) in order for those thermoelectric materials to perform well in the fields of power generation systems and the heating and/or cooling of materials. From inspection of the above equation, it appears that to provide a thermoelectric material having a high ZT, one need only fabricate on it a superlattice structure having relatively high values for its Seebeck coefficient, its electrical conductivity, and its temperature while, at the same time, having a relatively low value for its thermal conductivity.

It has proven difficult in practice to provide a thermoelectric material or a thermoelectric material having a superlattice structure that has a high thermoelectric figure of merit (ZT) value. Past findings in the art have suggested that the inherent interrelationships between the material properties included in the above equation for ZT such as carrier mobility, lattice thermal conductivity, power factor and Seebeck coefficient may limit, or place a ceiling upon, the ZT values of thermoelectric materials or thermoelectric materials having a superlattice structure.

As is also known in the art, multilayer systems prepared by molecular beam epitaxy (MBE) can provide materials having improved thermoelectric properties. Superlattice systems having reduced dimensionality have been proposed as a means to greatly enhance the thermoelectric figure of merit (ZT) as a result of the effects of confinement on the electronic density of states. It has also been shown that additional effects need to be included in order to obtain a more complete understanding of these complex structures.

The above discoveries have led to increasing interest in quantum-well and quantum-wire superlattice structures in the search to find improved thermoelectric materials for applications in cooling and power generation. Investigation of $Pb_{1-x}Eu_xTe/PbTe$ quantum-well superlattices grown by MBE yielding an enhanced ZT due to the quantum confinement of electrons in the well part of the superlattice structure have been conducted.

Quantum wells have two-dimensional carrier confinement whereas quantum wires have one-dimensional confinement of the carriers. Quantum wires have been calculated to have much higher ZTs than quantum wells due to improved confinement. And, it has been recognized that quantum dots (QDs) may have even higher ZT values than quantum wires.

Quantum dots have zero-dimensional confinement and represent the ultimate in reduced dimensionality, i.e. zero dimensionality. The energy of an electron confined in a small volume by a potential barrier as in a QD is strongly quantized, i.e., the energy spectrum is discrete. For QDs, the conduction band offset and/or strain between the QD and the surrounding material act as the confining potential. The quantization of energy, or alternatively, the reduction of the dimensionality is directly reflected in the dependence of the density of states on energy. For a zero-dimensional system (e.g. a QD superlattice), the density of states (dN/dE) of the confined electrons has the shape of a delta-like function $$(dN/dE)\alpha \sum_{\varepsilon_i} \delta(E-\varepsilon_i)$$

where $\epsilon_i$, are discrete energy levels and $\delta$ is the Dirac function. Thus, an enhanced density of states is a possibility even in partially confined QD superlattice (QDSL) structures.

It would, therefore, be desirable to provide a thermoelectric material or materials having a superlattice structure which have a relatively high thermoelectric figure of merit and which are suitable for usage in power generation systems, and in heating and/or cooling applications.

SUMMARY OF THE INVENTION

In view of the above, it has been recognized that an enhancement in the Seebeck coefficient, S, and the thermoelectric power factor, P=Q may occur for a suitable quantum dot (QD) superlattice (SL) structure in which the chemical potential lies within a few kTs of the delta-like function of the ground state or one of the excited states of the partially confined QDs. In addition, the chemical potential should lie near a suitable band edge of a good thermoelectric material. In real materials, tunneling, thermal and inhomogeneous broadening as well as a weak potential barrier surrounding the QD may contribute to reducing the confinement effect. An enhancement of the Seebeck coefficient and the power factor in the PbSeTe/PbTe QDSL system has been found.

In addition to the possibility of an enhancement in the power factor, it has been recognized that another advantage of having a QDSL structure is the enormous density of dissimilar materials interfaces (involving the wetting layer, the matrix layer, and dot layer of the QDSL structure) which is expected to lower the lattice thermal conductivity to values below those attainable by merely alloying. Tests on the reduction of the thermal conductivity of superlattices have shown that the values were much lower than that of their constituents and even smaller than the thermal conductivity value of the equivalent compositional alloys. It is thus believed that phonon engineering combined with power-factor engineering may result in large improvements in the ZT of already good thermoelectric materials.

In accordance with the present invention, a quantum dot superlattice (QDSL) includes a first plurality of layers formed from PbSeTe at least one of which has a quantum dot formed thereon and a second plurality of layers formed from PbTe with the PbTe layers corresponding to re-planarization layers over the layers having the QDs formed thereon layers and having characteristics such that the QDSL is provided having a relatively high thermoelectric figure of merit.

Large increases in Seebeck coefficient (S), power factor and thermoelectric figure of merit (ZT) have been measured in PbSeTe/PbTe quantum dot superlattice structures (QDSLs). The improvement in ZT is attributed to the following: (1) a more favorable carrier scattering mechanism due to adsorbed or precipitated extra Te, (2) the presence of $PbSe_{0.98}Te_{0.02}$ islands imbedded in a PbTe matrix and believed to result in partial confinement of electrons in QDs, and (3) the lowering of the lattice thermal conductivity to at least the values of the homogeneous pseudobinary $PbSe_xTe_{1-x}$ alloys. Experimental values for the Pb-chalcogenide film in-plane room-temperature ZT values have been increased from approximately 0.52 for PbTe/Te structures to 0.88 for $PbSe_{0.98}Te_{0.02}$/PbTe QDSL structures. Further improvements in the ZT are anticipated based on the potential for lowering the lattice thermal conductivity because of the enormous number of dissimilar material interfaces present in QDSL structures with periods in the 10-nm range. Also, many variables can be optimized including but not limited to the quantum dot quality, size, density, the substrate temperature, the growth rate, the stability of the beam equivalent fluxes with respect to time for thick films, post-growth procedures such as cool-down rate and annealing time and temperature. Optimization may also be possible by alloying with other compounds such as SnSe, SnTe, and PbS, for example. Of particular interest is the PbSnSSeTe/PbSnSeTe material system.

The thermoelectric properties of $PbSe_xTe_{1-x}$/PbTe quantum-dot superlattices for possible improved thermoelectric materials have been investigated and found to provide enhancements in Seebeck coefficient and thermoelectric figure of merit (ZT) relative to bulk values. It is believed that such improvements are due to the various physics and materials science phenomena associated with the quantum-dot structures. ZT values approximately double the best bulk PbTe values, with ZT as high as about 0.9 at 300° K. and conservatively estimated values as high as 2.0 at higher temperatures have been obtained in tests.

In accordance with the present invention, a QDSL structure includes a first plurality of layers of PbSeTe, each of said first plurality of layers including at least one quantum dot and a second plurality of layers of PbTe disposed in alternating relationship with the first plurality of layers of PbSeTe. With this particular arrangement, a superlattice structure is provided having a relatively high thermoelectric figure of merit (ZT). A superlattice having alternating layers of lead-selenide-telluride (PbSeTe) and lead-telluride (PbTe) is hereafter referred to as "PbSeTe/PbTe SL". The PbSeTe layers of the PbSeTe/PbTe SL have a composition of $PbSe_xTe_{1-x}$, where $0 \leq x \leq 1$. In a preferred embodiment, x equals 0.98. It should be appreciated, however, that other values of x may result in QDSLs having equally high or even higher ZT values.

The PbSeTe/PbTe SL has a lattice thermal conductivity more than twice as low as typical lattice thermal conductivity values of PbTe. Moreover, the lattice layer combinations of the PbSeTe/PbTe SL give rise to a high power factor value. Additionally, the value of the Seebeck coefficient of the PbSeTe/PbTe SL is also high because the SL has quantum dots and near optimal residual strain.

In contrast to the $Pb_{1-x}Eu_xTe/PbSe$ quantum well superlattices, the PbSeTe quantum dot (QD) superlattice starts out growing each period as quantum wells on the PbTe matrix layer but after approximately two monolayers of PbSeTe growth, three-dimensional triangular-based pyramidal structures are formed. These nanometer-sized dots form because the strain in the lattice between the PbTe matrix material and the PbSeTe quantum-well material becomes too great for sustained atom-layer-by-atom-layer growth. In order to reduce the strain, the growth (Stranski-Krastanov growth mode) proceeds spontaneously as three-dimensional triangular-based PbSeTe pyramidal-shaped structures. There can be as many as $10^{11}$ cm$^{-2}$ dots formed on the PbSeTe so-called wetting layer. The dot growth is halted at the optimal dot physical size and dot area density. Then, PbTe is grown to planarize the surface so that the growth mechanism reverts back to the atom-layer-by-atom-layer process.

The above cycle has been repeated as many as 7,235 times or repetitions or periods, which results in sample thicknesses of up to approximately 100 micrometers.

For the Pb-chalcogenides, a lattice constant difference between the matrix and wetting layers of at least approximately 3% must occur in order for the strain to be large enough to cause the dots to form. For example, $PbSe_{0.2}Te_{0.8}$/PbTe superlattices do not form quantum dots because the lattice constant differential between $PbSe_{0.2}Te_{0.8}$ and PbTe is too small.

Tests on PbTe/PbSeTe quantum dot superlattices show that these structures exhibit higher ZT values than the quantum well SL structures. It is believed that the improved results are a consequence of the fact that the predominant mechanisms of the quantum well (QW) and QD structures are different. That is, even though the QW structures show enhanced ZT values due to electron confinement (as do the quantum dot structures), the enhancement effect is much stronger in the quantum dot structures. It has been learned that in order to achieve a ZT value of about 0.9 at room temperature, QDs were absolutely essential. That is, enhanced density of states due to the partial confinement of electrons in the quantum dot superlattice structure are believed to be essential to achieving the enhanced room temperature ZT values. In addition to the predominant carrier confinement mechanism due to QDs (and to a much lesser extent in the QWs), an optimal PbTe to Te flux ratio was needed in order to optimize the electron carrier scattering mechanism.

BRIEF DESCRIPTION OF THE DRAWINGS

The foregoing features of this invention, as well as the invention itself, may be more fully understood from the following description of the drawings in which.

Figure 1:
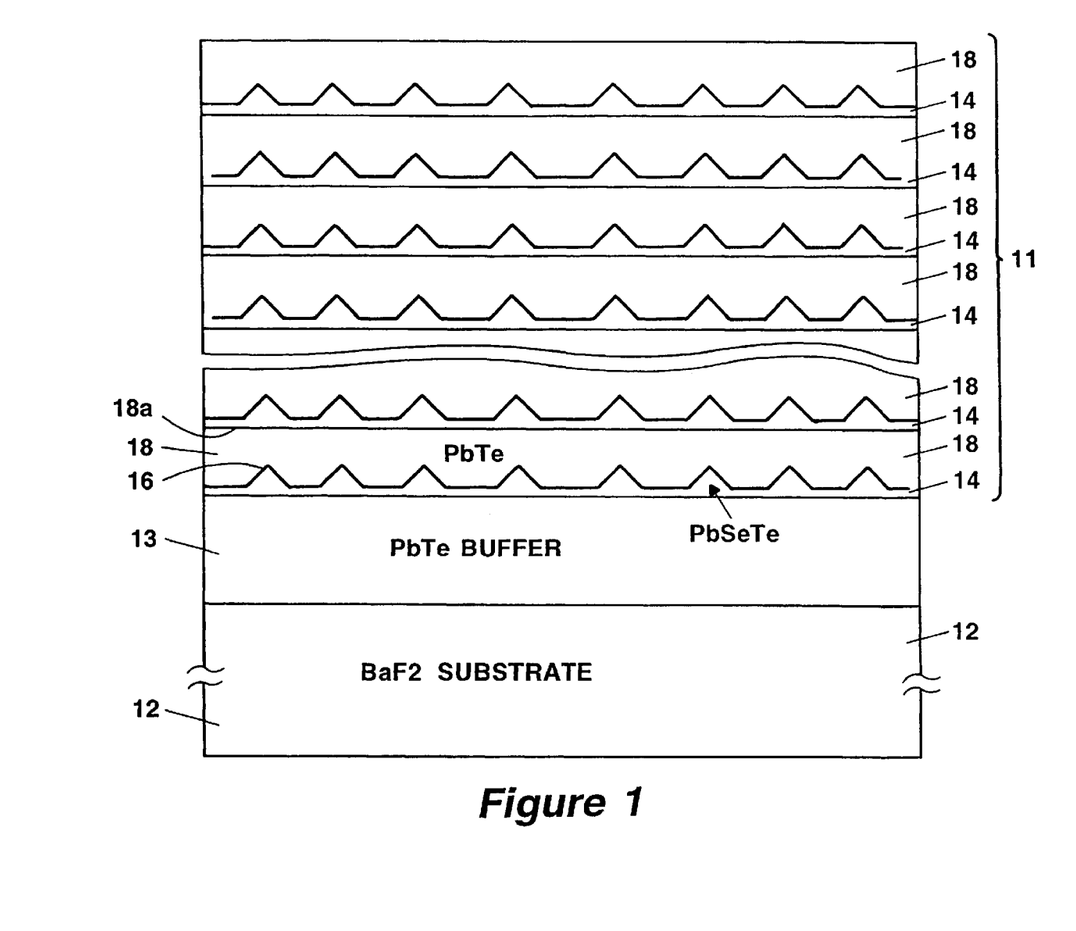
FIG. 1 is a cross-sectional view of a doped (Bi for n type) PbSeTe/PbTe QD superlattice structure disposed over a Bi-doped PbTe buffer layer and a $BaF_2$ substrate.

DETAILED DESCRIPTION OF THE INVENTION;

Referring now to FIG. 1, a lead selenide-telluride (PbSeTe/PbTe) QD superlattice (SL) structure 11 is shown disposed over an insulating barium-fluoride ($BaF_2$) substrate 12 wherein a lead-telluride (PbTe) buffer layer 13 is adjacent to the $BaF_2$ substrate 12. Those of ordinary skill in the art will appreciate that although buffer layer 13 is here provided as PbTe, other materials which provide an atomically smooth interface for subsequent growth of a superlattice may alternatively be used.

The PbSeTe/PbTe SL structure 11 is comprised of m layers of a doped wetting layer material 14 alternating with n layers of a doped barrier (matrix) material 18. The values of m and n are equal, and are typically in the range of 200 to 10,000, with values in the range of about 6,500 to 7,500 being preferred and values in the range of about 6,600 to about 7,300 being most preferred.

In one embodiment of the present invention, the QDSL structure 11 is provided from a $PbSe_{0.98}Te_{0.02}$/PbTe superlattice structure along with the approximately 200-nm-thick Bi-doped PbTe buffer layer 13 and the (111) $BaF_2$ substrate 12. Quantum dots (QD) 16 form on the PbSeTe wetting layers 14 while the PbTe layers 18 provide a replanarizing layer 18 having a surface 18a over which more wetting layers and more QDs 16 form.

To select a suitable material for the QDSL structures 11, the following criteria can be used: (1) a lattice mismatch of approximately 2% or greater between the two components of the superlattice; (2) a good thermoelectric material for both components of the superlattice (e.g. a thermoelectric material having a thermoelectric figure of merit ZT in the range of about 0.2 to 1.0); (3) static dielectric constants higher than 100 at 77° K. for both components of the superlattice; and (4) any (pseudobinary, pseudoternary, etc.) alloy formed by both or either components of the QDSL with lattice thermal conductivity minima below 15 mW/cm-K).

A significant lattice mismatch is needed in order for islands or dots 16 to form. A good thermoelectric material is needed in order to start with a reasonably high ZT. It is conjectured that a high static dielectric constant is needed not only to suppress impurity scattering of the electron carriers but also to minimize interface scattering of the carriers. ZT increases as the lattice thermal conductivity decreases for constant temperature, power factor, and electronic part of the total thermal conductivity. Upon considering the above criteria, the PbSeTe/PbTe superlattice system appears to be a very good model system for investigation of thermoelectric QDSL phenomena.

The growth and characterization of QDSL structures composed of $PbSe_{0.98}Te_{0.02}$ QDs and PbTe matrix layers act as a first step to realizing large improvements in the ZT of a QDSL thermoelectric material.

Conventional systems utilizing PbSe deposited on a PbTe surface did not recognize that quantum dots may be useful in some PbTe or PbSe-based systems for thermoelectric applications. Rather the art focused on understanding the structures and growth mechanisms. The QDSLs of the present invention, on the other hand, provide a structure having improved thermoelectric characteristics.

The islands or QDs 16 form in order to reduce the large heteroepitaxial free energy component and allow the strain in the $PbSe_{0.98}Te_{0.02}$ to partially relax. The islanding process reduces the interface energy by limiting the contact of the $PbSe_{0.98}Te_{0.02}$ with the PbTe surface upon which it is grown, and allows the $PbSe_{0.98}Te_{0.02}$ free surface to at least partially relax. The strain-induced islanding technique produces the QDs and is called the Stranski-Krastanov epitaxial growth mode. When enveloped by PbTe matrix material, these islands may possibly be used to partially confine the electrons in the QDs.

For the experimental realization of a large number of QDs with reasonable size, density, quality, and uniformity, molecular beam epitaxy (MBE) is used because of its atom-layer by atom-layer control, reproducibility, and flexibility. Another advantage of MBE-grown Pb-salt structures is that the sticking coefficients of well-known MBE growth chamber contaminants is unusually low.

MBE growth was carried out in a modified 360-type (T-series) growth chamber with an associated load-lock chamber. The substrate is mounted on a molybdenum substrate holder with the use of an indium-gallium (InGa) alloy solder, which is approximately at the eutectic composition of the alloy. The effusion cells on the cell flange currently being used for the growth of PbSeTe/PbTe superlattice structures contain PbTe, PbSe, BiSb or $Bi_2Te_3$, and Te. The substrate manipulator that contains the substrate holder, an internal fixed heater and an ionization gauge to measure fluxes, is on a horizontal axis and provides rotation along the axis of the manipulator. This rotation is used to shift the substrate from the "growth" to the "transfer" position. The manipulator includes X, Y, and Z motions and allows the axis location to be adjusted with precision micrometers. The MBE substrate holder accommodates $BaF_2$ substrates with 18×18-mm square shape.

A deposition chamber in which the process is carried out is equipped with monitoring reflection high-energy electron diffraction (RHEED) in addition to beam-flux and background-pressure nude Bayard-Alpert vacuum gauges. A 30-keV RHEED system (used at 12 keV) was employed during film growth to optimize and monitor the deposition. The electron beam is directed to the sample surface with small incidence angles of about 0.3°. Alternating RHEED streaks and chevron-shaped dots are observed throughout the growth runs of the QDSL structures.

Molecular and atomic beam fluxes arriving at the substrate location can be monitored via the beam-flux ion gauge. The main flux measurement tool is the nude Bayard-Alpert gauge, mounted on the manipulator, by which it may be rotated into the substrate position. In this position, the beams from the individual sources can be monitored and calibrated. Precise run-to-run control of composition requires precise knowledge of the PbTe, PbSe and Te beam fluxes. The beam flux of the n-type dopant source (BiSb or $Bi_2Te_3$) is adjusted and monitored by measuring the Hall coefficient of grown films by the van der Pauw method.

The typical growth rate is 0.8 to 1.4 $\mu$m/hr. The carrier concentration of the calibration PbTe and $PbSe_{0.98}Te_{0.02}$ growth runs and the $PbSe_{0.98}Te_{0.02}$/PbTe superlattice structures are calculated from the Hall coefficient. For the growth of the $PbSe_{0.98}Te_{0.02}$/PbTe superlattice structures, the BiSb or $Bi_2Te_3$, and Te shutters are open during the entire growth run, whereas the PbTe and PbSe shutters are alternately opened and closed. The $PbSe_{0.98}Te_{0.02}$ layer spontaneously grows in the form of QDs and PbTe grows to replanarize the surface. This behavior automatically repeats itself for greater than 200 periods.

After the growth of a 0.6- to 0.7-nm-thick wetting layer, $PbSe_{0.98}Te_{0.02}$ spontaneously grows in the form of QDs. The PbTe grows to replanarize the surface. This behavior automatically repeats itself for over 600 periods in these test structures.

The above technique provides PbTe-based thermoelectric superlattice (SL) structures having significantly enhanced thermoelectric power factors and figures of merit as shown and discussed in conjunction with FIGS. 5 and 7 below.

N-Type Doping in Pb-Chalcogenide Thermoelectric QDSL Structures

It is well known that lead chalcogenides can be doped by varying the Pb-to-chalcogenide ratio, but this is not the best way to dope the material. Lead vacancies can dope the material p-type whereas chalcogenide vacancies can dope the material n-type. However, the vacancy dopant mechanism yields maximum carrier concentrations of about $1.06 \times 10^{18}$ cm$^{-3}$. The MBE system of the present invention uses thermally evaporated $PbSe_{0.98}Te_{0.02}$ and PbTe material because of the low growth temperature (300° C. to 330° C., as determined by infrared pyrometry) whereas the optimum carrier concentration for a good Pb-chalcogenide thermoelectric material is $6 \times 10^{18}$ cm$^{-3}$ or higher at 300° K. Thus, an impurity must be used for doping.

Figure 2:
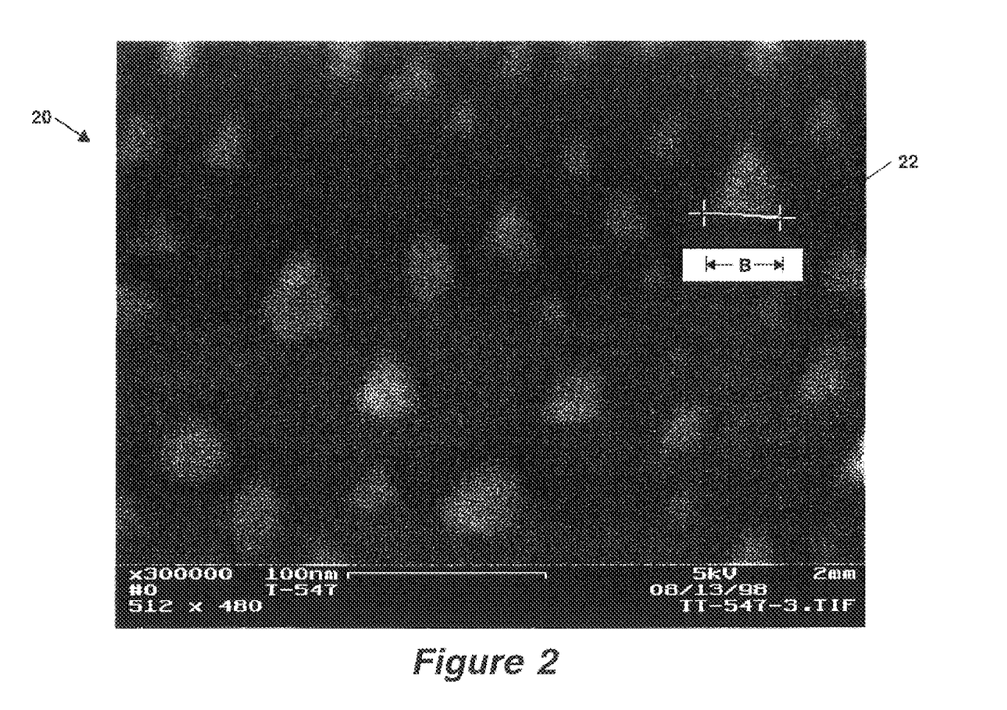
FIG. 2 is a field emission-scanning electron microscope (FE-SEM) image of quantum dots (QDs)

Referring now to FIG. 2, an FE-SEM image of the quantum dots (QDs) 22 in one layer of a $PbSe_{0.98}Te_{0.02}$/PbTe superlattice 20 shows that the triangular-shaped base of the largest dots have a length B equal to about 40 nanometers (nm). The height-to-base aspect ratio of the pyramidal structure is less than 1:3.3 which is much larger than for other material systems. A calculated height-to-base aspect ratio value of 1:2.2 is obtained using the 13 nm height values from FIG. 4. Thus, one notable feature of the QDs of the present invention is their narrow size distribution relative to other materials systems (more clearly seen in FIG. 4 below).

Prior art QD systems report relative height variation of ±7% to ±15%. The significance is that the energy broadening of the ground and excited states are expected to be less for QD's nearly all the same size which translates to greater quantum enhancement. Thus, QDSL structures in which the QDs have relatively uniform height having greater quantum enhancement. Other material systems of interest are Group III–V, II–VI compounds, as well as Group IV alloys (e.g. Si/Ge alloys).

Figure 3:
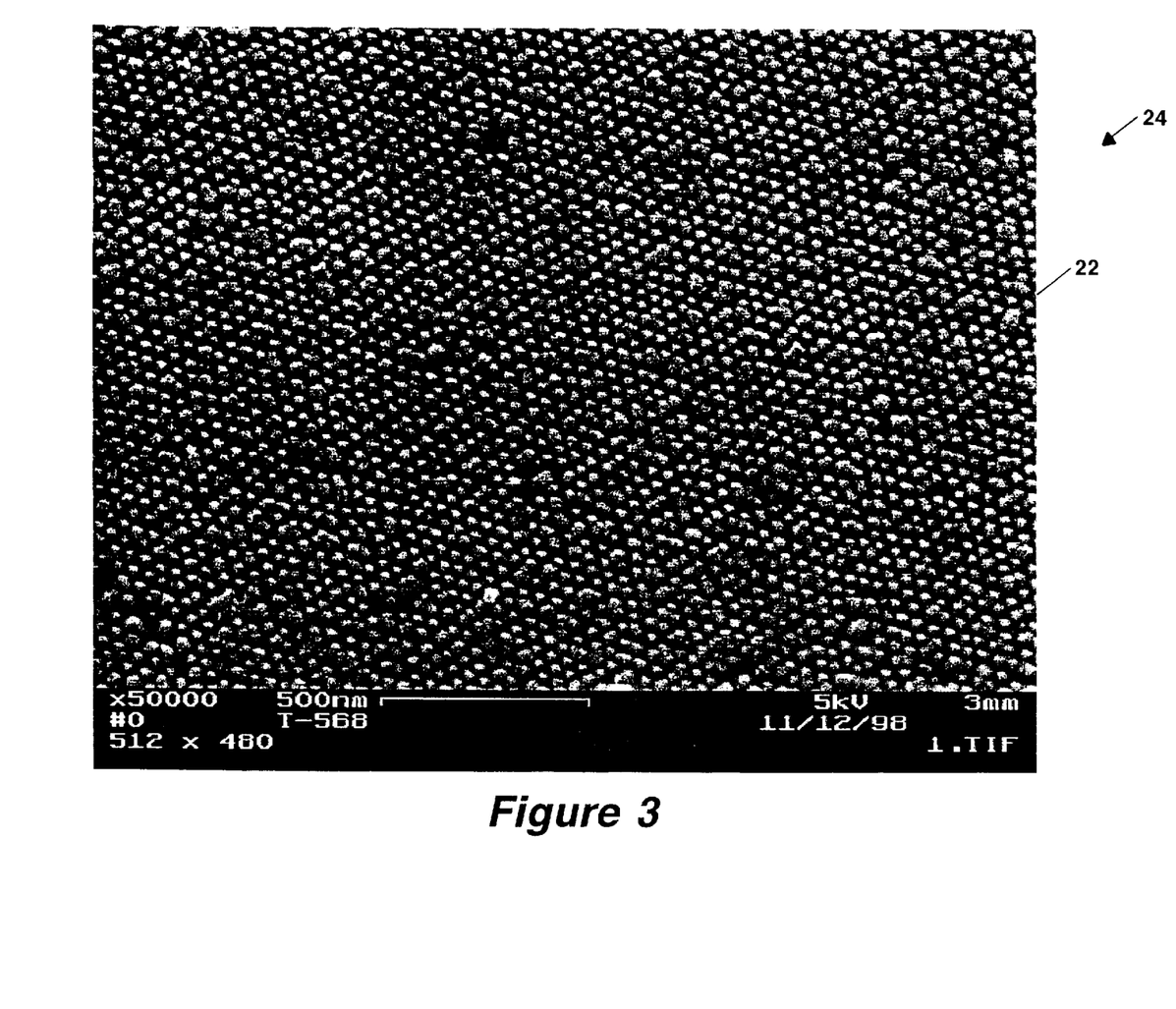
FIG. 3 is an FE-SEM image of QDs after growth of a PbSeTe layer and without planarization.

Referring now to FIG. 3, a FE-SEM image 24 at 50,000× magnification of the QDs 22 after growth of the 240th $PbSe_{0.985}Te_{0.015}$ layer and without the PbTe replanarization layer. The film was rapidly cooled to room temperature to preserve this epitaxial surface structure. The white "dots" are the individual quantum dots 22 in the planar array 24. There are approximately $9 \times 10^{10}$ quantum dots/cm$^2$ in each period of the superlattice. The height-to-base aspect ratio of less than 1:3 is much larger than for other material systems, and their narrow size distribution is much narrower than that of other materials systems.

Atomic force microscopy (AFM) images also show that the height-to-base aspect ratio of about 1:3 is much larger than for other materials systems, and their narrow size distribution is much narrower than that of other materials systems.

Figure 4:
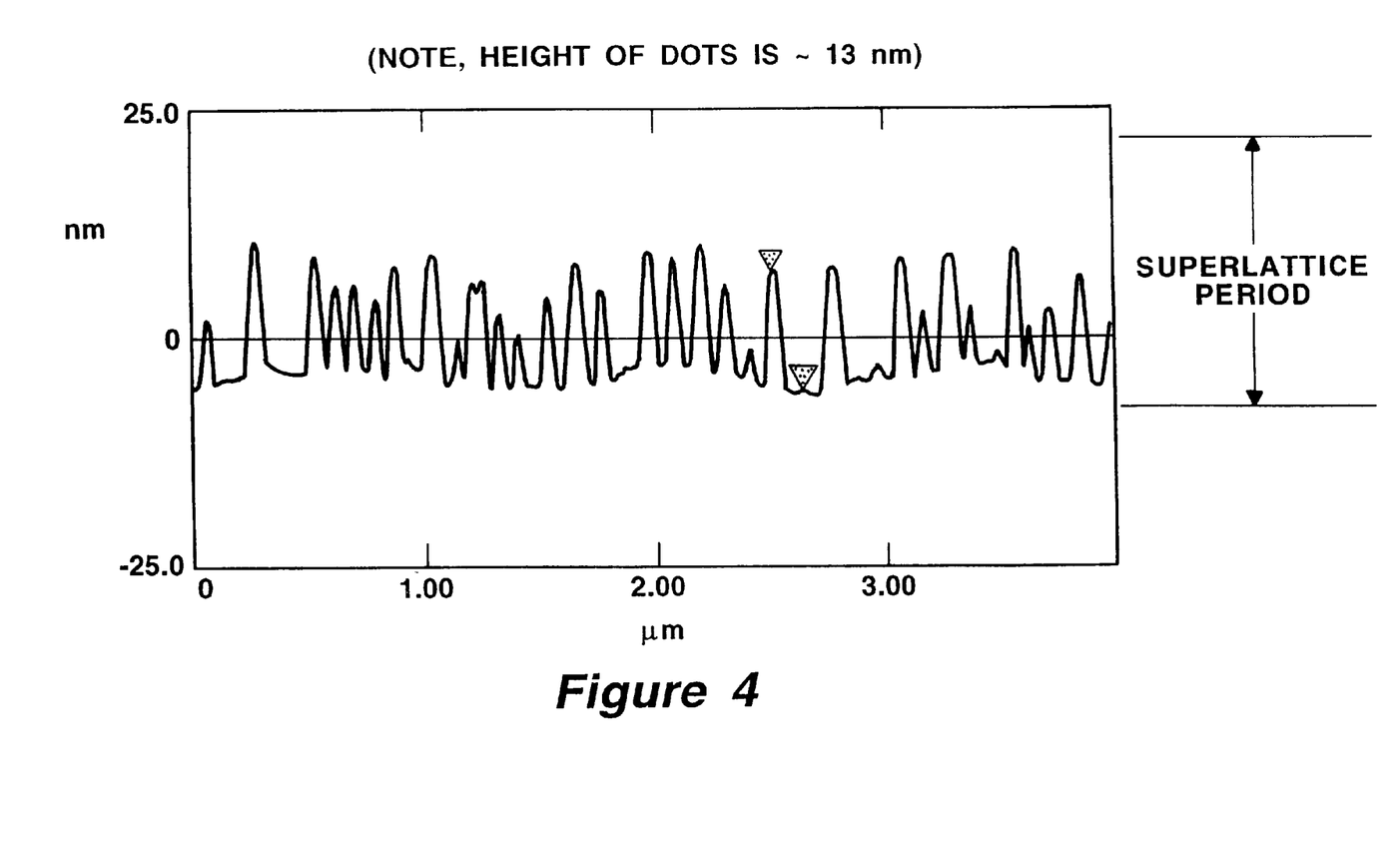
FIG. 4 is a plot of dot heights as determined by atomic force microscopy (AFM) of an ordered multi-period PbSeTe/PbTe QDSL.

Referring now to FIG. 4, dot heights as determined by AFM are shown for sample 547 and are approximately 13 nm. Since the FE-SEM images of this sample show that the triangular-shaped base of the largest dots are about 40 nm, the height-to-base aspect ratio of about 1:3 is much larger than for other materials systems, and their narrow size distribution is much narrower than that of other materials systems. Thus, it is expected that given the narrower size of dots and the uniform distribution of the dots, the quantum enhancement effect should be greater than prior art QD structures.

Figure 4A:
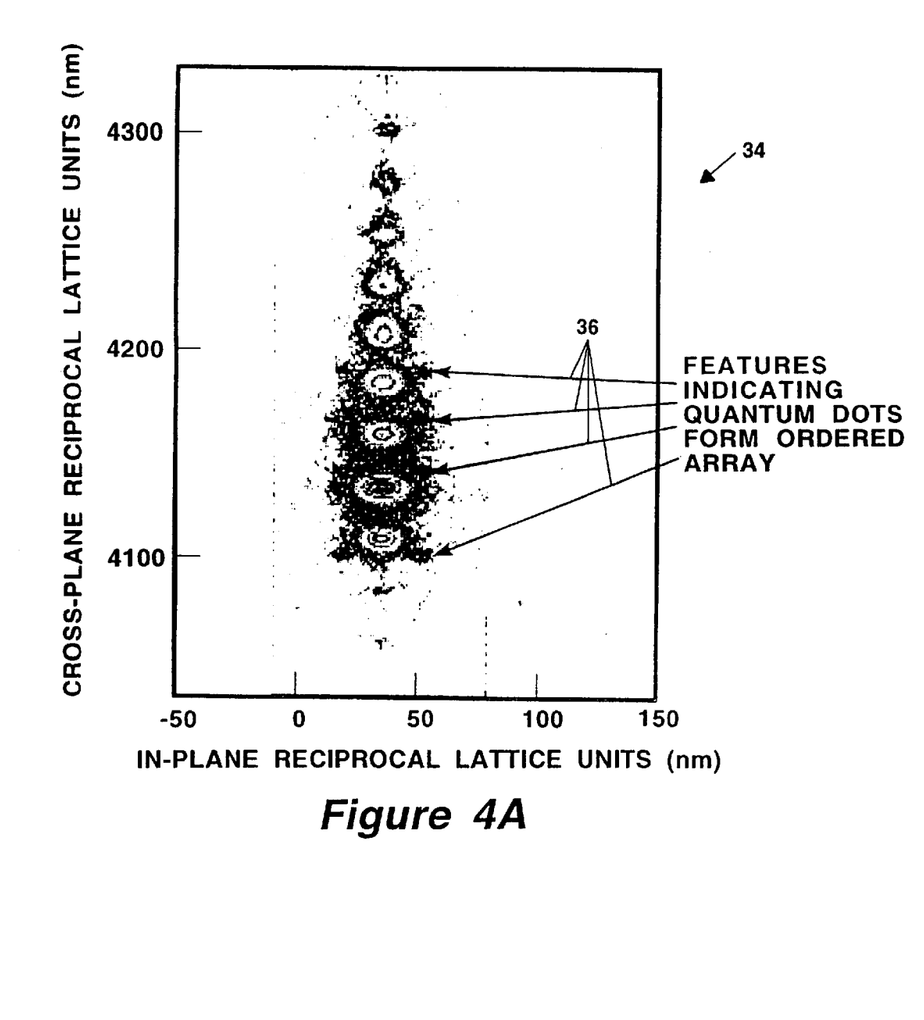
FIG. 4A is a plot of a x-ray diffraction reciprocal lattice space map measured in one azimuthal direction for an ordered multi-period PbSeTe/PbTe QDSL.

Referring now to FIG. 4A, a plot of an x-ray diffraction reciprocal lattice space map 34 measured in one azimuthal direction for an ordered 240-period $Se_{0.985}Te_{0.015}$/PbTe QDSL (growth run T-568) is shown. In this map, the data show a number of satellite peaks 36 not only in the cross-plane direction but also a few in the direction parallel to the surface of the film. This subtle feature indicates that the dot positions are correlated both laterally and vertically, that is, the dots create a true periodic lattice in all three directions. Periodicity indicates sharp transitions between the PbTe matrix and the PbSe wetting layer (cross-plane) (i.e. the QDSL has transitions which are sharp as compared to an alloy broadening effect due to growth temperatures). In-plane periodicity indicates that the dots are ordered, i.e. they form a crystal structure of their own where the dots are like big atoms embedded in a matrix. The periodicity is good for quantum enhancement and probably the change in phase from PbTe to PbSeTe is good for phonon interface scattering enhancement which may lead to lower lattice thermal conductivites than merely alloying.

Figure 5:
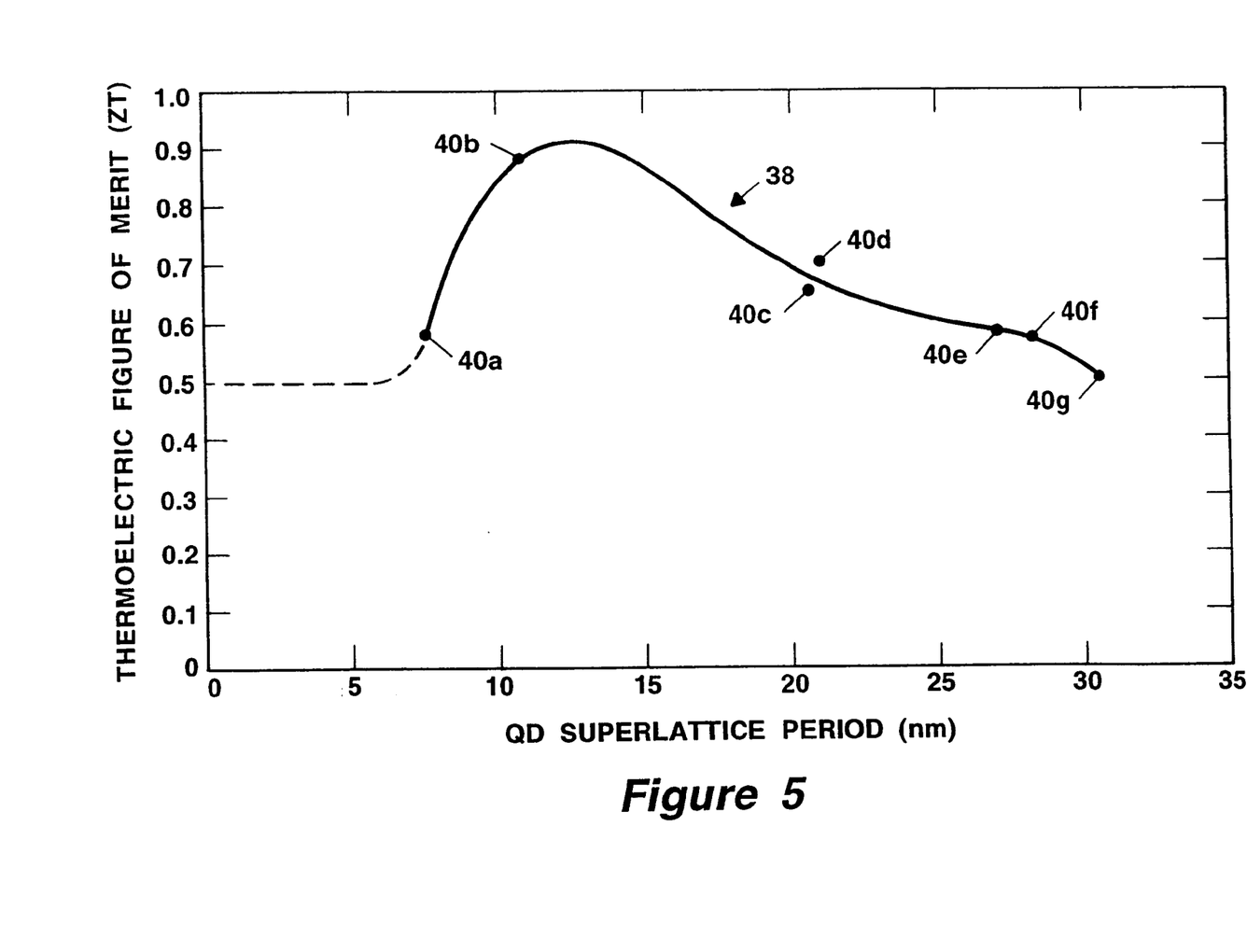
FIG. 5 is a plot of thermoelectric figure of merit versus QD superlattice period.

Referring now to FIG. 5, a plot 38 of the thermoelectric figure of merit vs QDSL period is shown for a series of seven experiments the results of which are shown as data points 40a–40g. In each of the experiments, the equivalent psuedobinary composition of 0.13 mole fraction PbSe was held constant along with various growth and process parameters. The superlattice formed an equivalent alloy of $PbSe_{0.13}Te_{0.87}$ with $\kappa_1=11.6$ mW/cm-K.

It is believed that if quantum dots play an important role in enhancing ZT then the following behavior should occur: (1) at small SL periods no enhancement should be observed because only a very thin strained wetting layer of PbSeTe should be grown for each period with no dots being formed for each period, i.e. atom-layer-by-atom layer growth throughout; (2) then, as the PbSeTe deposition increases further, QDs will form but be too few in number density and too small in size to cause much enhancement in ZT; (3) as the deposition per period increases further and the dot size increases, the dot number density is expected to increase due to the dot nucleation site density increasing at a rapid rate to a saturation value; (4) then as the deposition per period increases further, the dot number density decreases because the planar arrays of dots become farther apart; (5) Finally, as the PbSeTe and PbTe deposition of each period is further increased, the dot density will continue to decrease and the dot size will become too large for effective confinement due to coalescence of dots.

As seen from an inspection of FIG. 5, the maximum ZT values achieved for each of the seven experiments indicated by data points 40a–40g are consistent with the above enumerated effects and adds to the evidence, in addition to the Seebeck enhancement, that the QDs are acting as a media of partial carrier confinement and hence Seebeck coefficient and ZT enhancement.

Figure 6:
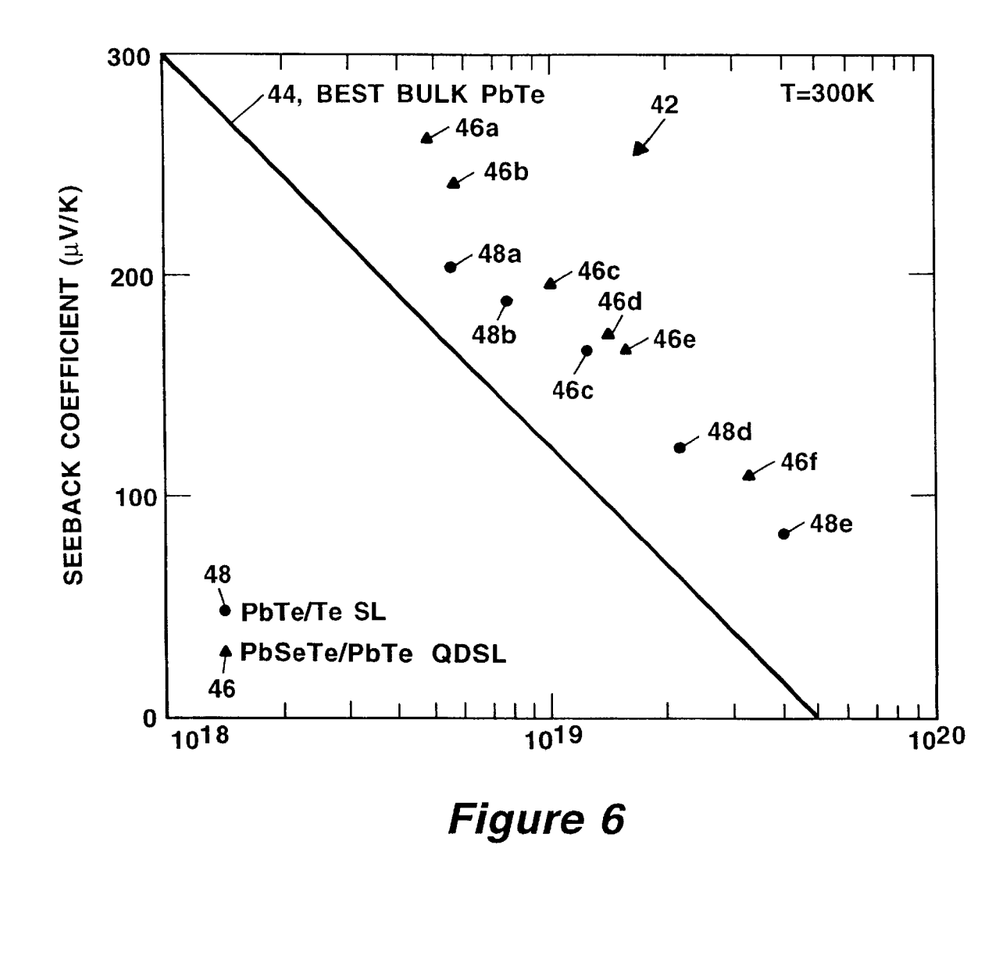
FIG. 6 is a plot of Seebeck coefficient vs carrier concentration for n-type PbTe based structures.

Referring now to FIG. 6, a plot 42 of the Seebeck coefficient vs carrier concentration at 300° K. is shown. Line 44 represents data points for the best bulk PbTe. Points 46 represents data for the PbTe/Te superlattice and points 48 represents data for the new PbSeTe/PbTe QDSL structures. The data indicates that the Seebeck coefficient of the best bulk PbSe follows the same curve as the PbTe and may be described by the following empirical Seebeck coefficient, S, vs carrier concentration, n, relationship, i.e.

$$S(\mu V/K) = -477 + 175 \log_{10}(n/10^{17} \text{ cm}^{-3}) \qquad \text{(Eq. 2)}$$

Currently, the most plausible explanation for the Seebeck coefficient enhancement for the PbTe/Te data shown in FIG. 6 appears to be that the effective scattering parameter, r, is increased due to the extra scattering introduced by the extra Te absorbed periodically in the PbTe lattice. The increased Seebeck coefficient enhancement for the QDSL structure is believed due to quantum effects from the reduced dimensionality of partially confined electrons in the $PbSe_{0.98}Te_{0.02}$ QDs as well as a more favorable scattering mechanism. The Seebeck coefficients of all $PbSe_{0.98}Te_{0.02}/PbTe$ samples in FIG. 6 are much greater than the values calculated from the S vs n relationship of Eq. (2).

Figure 7:
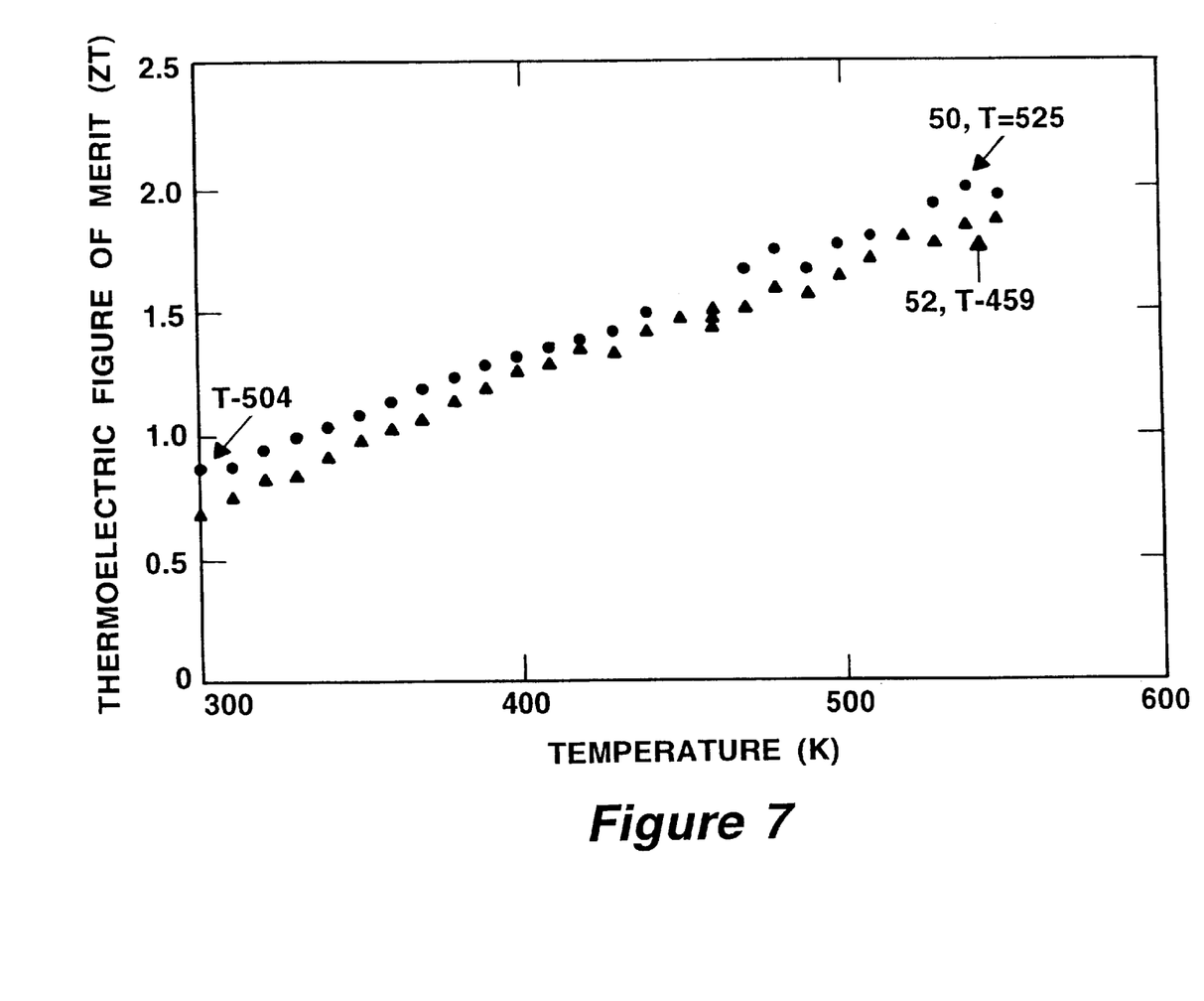
FIG. 7 is a plot of thermoelectric figure of merit versus temperature.

Referring now to FIG. 7, the thermoelectric figure of merit (ZT) vs. temperature curves for two n-type $PbSe_{0.98}Te_{0.02}/PbTe$ QDSL samples are shown in FIG. 7.

TABLE I

| Sample Number | Thickness PbSeTe undoped $d_b$(nm) | PbTe Bi-doped $d_w$(nm) | Number of Periods | Sample Thickness ($\mu$m) |
|---|---|---|---|---|
| T-459 | 2.0 | 22 | 190 | 4.60 |
| T-525 | — | — | 1327 | 7.22 |
| T-547 | 2.4 | 17.1 | 336 | 6.55 |
| T-594 | 1.4 | 9.4 | 502 | 5.42 |

TABLE II

| Sample No. | Seebeck Coefficient ($\mu$V/K) | Power Factor ($\mu$W/cm-K$^2$) | $Z_{3D}T$ | Carrier Concentration n (cm$^{-3}$) | Carrier Mobility $\mu$ (cm$^2$/V-s) |
|---|---|---|---|---|---|
| T-459 | −171 | 49.5 | 0.69 | $1.5 \times 10^{19}$ | 720 |
| T-525 | −212 | 36.0 | 0.80 | $7.0 \times 10^{18}$ | 715 |
| T-547 | −105 | 35.4 | 0.38 | $3.3 \times 10^{19}$ | 600 |
| T-594 | −266 | 40.9 | 0.88 | $5.3 \times 10^{18}$ | 675 |

These ZT values were obtained from the measured Seebeck coefficient and electrical resistivity values along with calculated thermal conductivity values. The calculated thermal conductivity values are based on the Wiedemann-Franz law and published experimentally derived values of the lattice thermal conductivity $\kappa_L$ for the mean or equivalent alloy composition of the QDSL samples.

It is well known that $PbTe_{0.5}Se_{0.5}$ has a much lower lattice thermal conductivity than either PbTe or PbSe at 300° K. by a factor of 2 to 2.5. The equivalent alloy compositions (EACs) of T-459 and T-525 were determined as approximately $PbTe_{0.93}Se_{0.07}$ and $PbTe_{0.86}Se_{0.14}$ (similarly, the EAC of T-594 is $PbTe_{0.87}Se_{0.13}$) from x-ray diffraction and growth parameters. The lattice thermal conductivity was estimated to be 11.6 mW/cm-K for sample 594 at 300 K. However, recent experimental results on the lattice thermal conductivity of Si/Ge superlattice structures (a 4.2% lattice-mismatched system) suggest that the above estimates for the lattice thermal conductivity of $PbSe_xTe_{1-x}/PbTe$ (a 5.2% lattice mismatched system) superlattice films are too high. To be conservative, we used the values from E. D. Devyatkova and V. V. Tikhonov, Sov., Phys.-Solid State 7, 1427 (1965) measured on bulk alloys of PbSeTe alloys in our estimates of ZT shown in FIG. 4. Nevertheless, some very high ZTs in these $PbSe_{0.98}Te_{0.02}/PbTe$ superlattice samples of up to 0.9 at 300° K. and 2.0 at 550° K. Thus, these MBE-grown $PbSe_{0.98}Te_{0.02}/PbTe$ superlattice samples have shown significantly enhanced Seebeck coefficients, power factors and ZTs.

Figure 8:
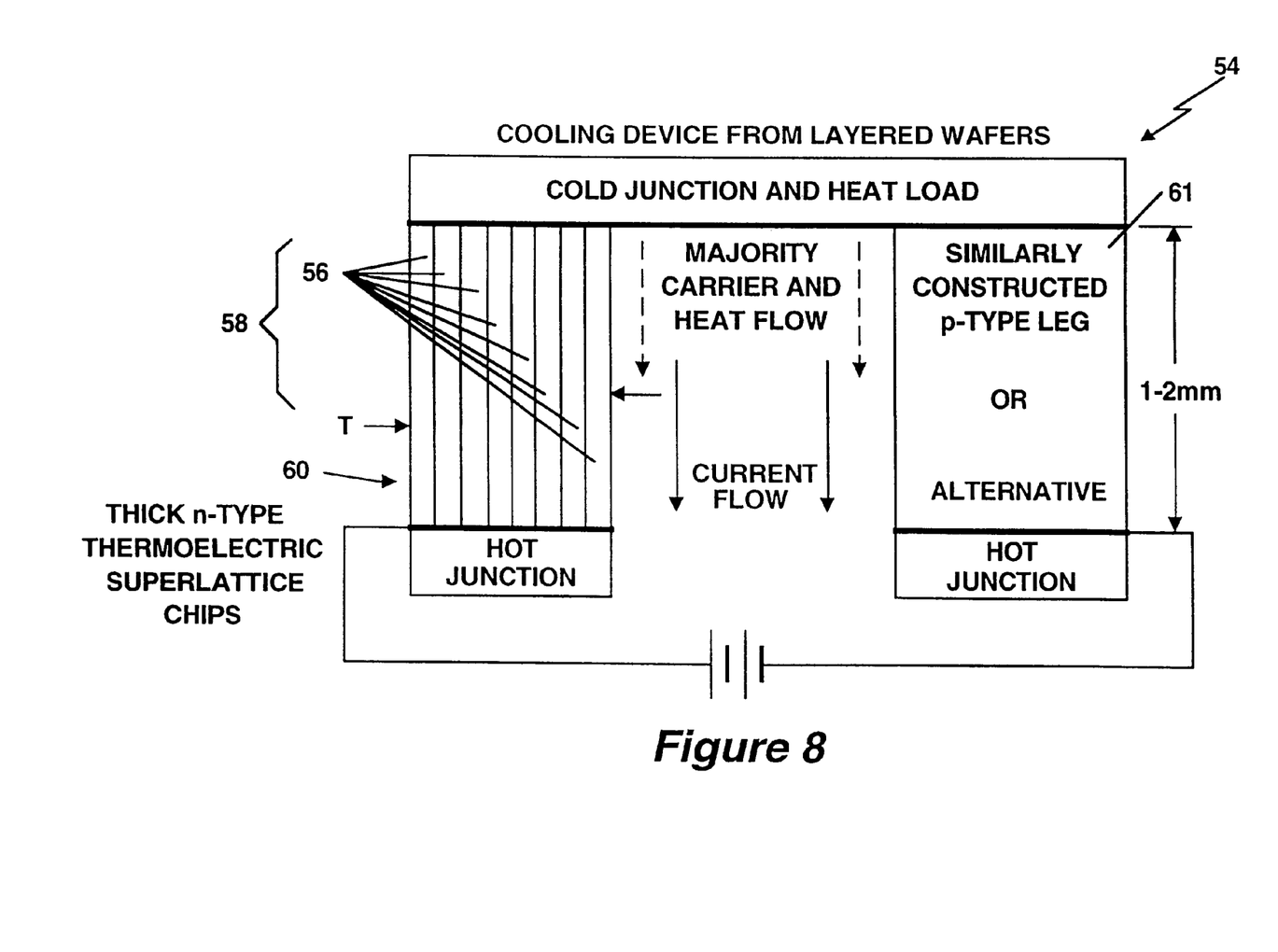
FIG. 8 is a block diagram of an exemplary thermoelectric cooling module.

Referring now to FIG. 8, the MBE-grown layered structures may be assembled into bulk thermoelements for cooling, heating or power generation modules by removing the substrate 12 (FIG. 1), cutting the chips 56 into a predetermined size having a length L and a width W (e.g. 2×2 mm), stacking and bonding (e.g. by soldering) the chips into small cubically-shaped thermoelectric elements 58 having a thickness T, as shown, for example, in FIG. 8. The process of forming thermoelements, per se, is well known. In one embodiment, the chips 56 are provided as thick n-type thermoelectric superlattice chips.

From these cubes, thermoelectric cooling modules can be fabricated from layered wafers. For example, n-type superlattice structures 58 may be used as the n-type leg 60 of a multi-stage thermoelectric module. Thermoelectric modules using this new type of material may be used for various purposes, including, for example, commercial refrigeration and air-conditioning equipment, the development of cryogenic coolers for infrared thermal imaging, superconductive electronics, and other quantum device applications.

While multiple n-type and p-type thermoelement pairs in each stage of a multistage unit have been required for cryogenic coolers, it may not be necessary to develop a new p-type leg for high-performance modules. For example, in view of the superiority of the n-type thermoelements, the p-type leg 61 of FIG. 8 may be replaced by a passive thermoelement, e.g., one that has close to zero Seebeck coefficient but which has a high ratio of electrical to thermal conductivity. It is known that the Seebeck coefficient is zero in superconductors but the ratio of the electrical to thermal conductivity is infinite. Consequently, a thermoelectric module or stage made with the new n-type superlattice thermoelement and a superconductor has a ZT precisely that of the n-type superlattice thermoelement.

Figure 9:
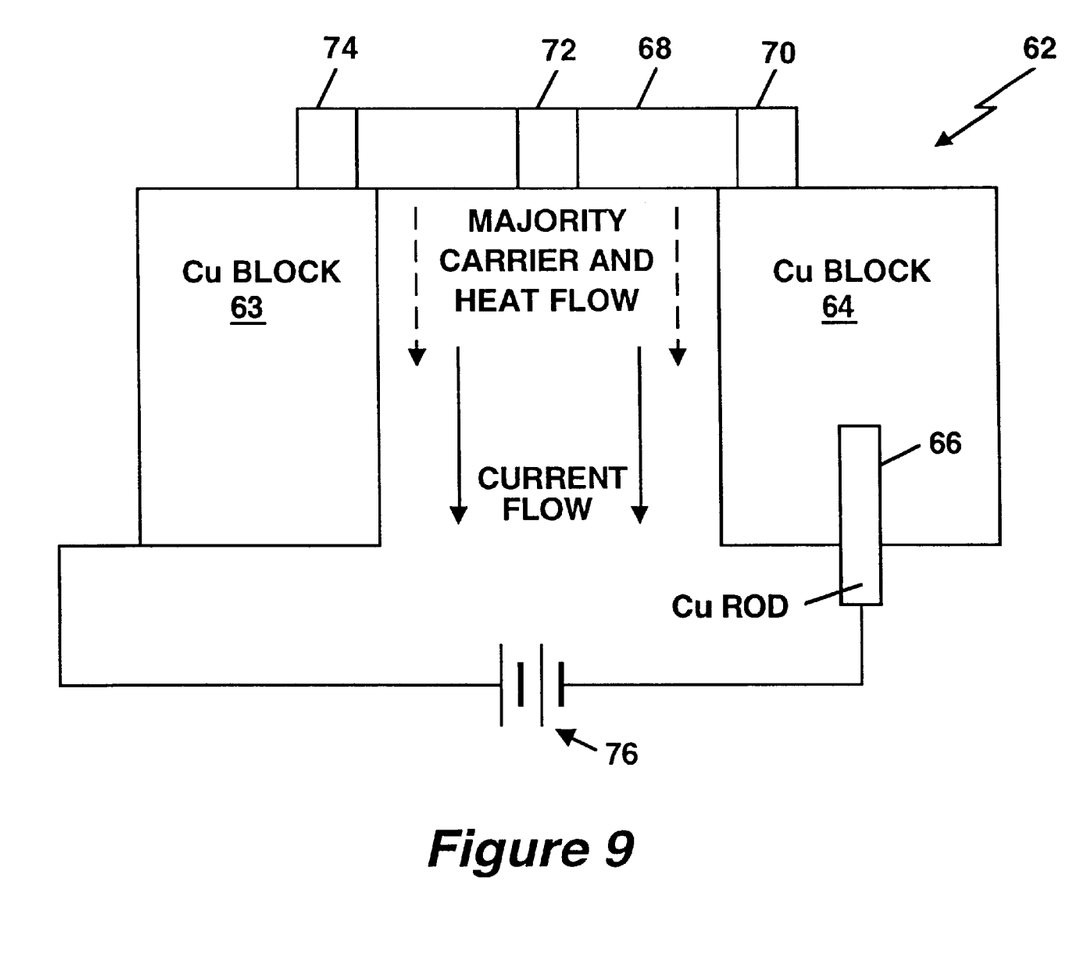
FIG. 9 is a block diagram of an exemplary thermoelectric module utilizing QDSL.

Referring now to FIG. 9, a thermoelectric device test set up 62 includes a pair of copper (Cu) blocks 63, 64. Block 63 and 64 has a copper rod 66 coupled thereto. A cantilever structure 67 connects the blocks 63, 64. The cantilever structure 67 is provided from a p-type $Bi_2Te_3$ alloy and a n-type QDSL. The structure 67 is coupled at one end to the block 64 by solder and a chromel-alumel thermocouple 70. A second chromel-alumel thermocouple 72 is coupled (e.g. soldered) to the center of the structure 67 while a second end of the structure is coupled to a Cu block 63 with a solder connection. The thermo-elements 68, 69 form n-type and p-type arms, respectively. With a battery coupled as shown, current flows in the direction indicated.

Figure 10A:
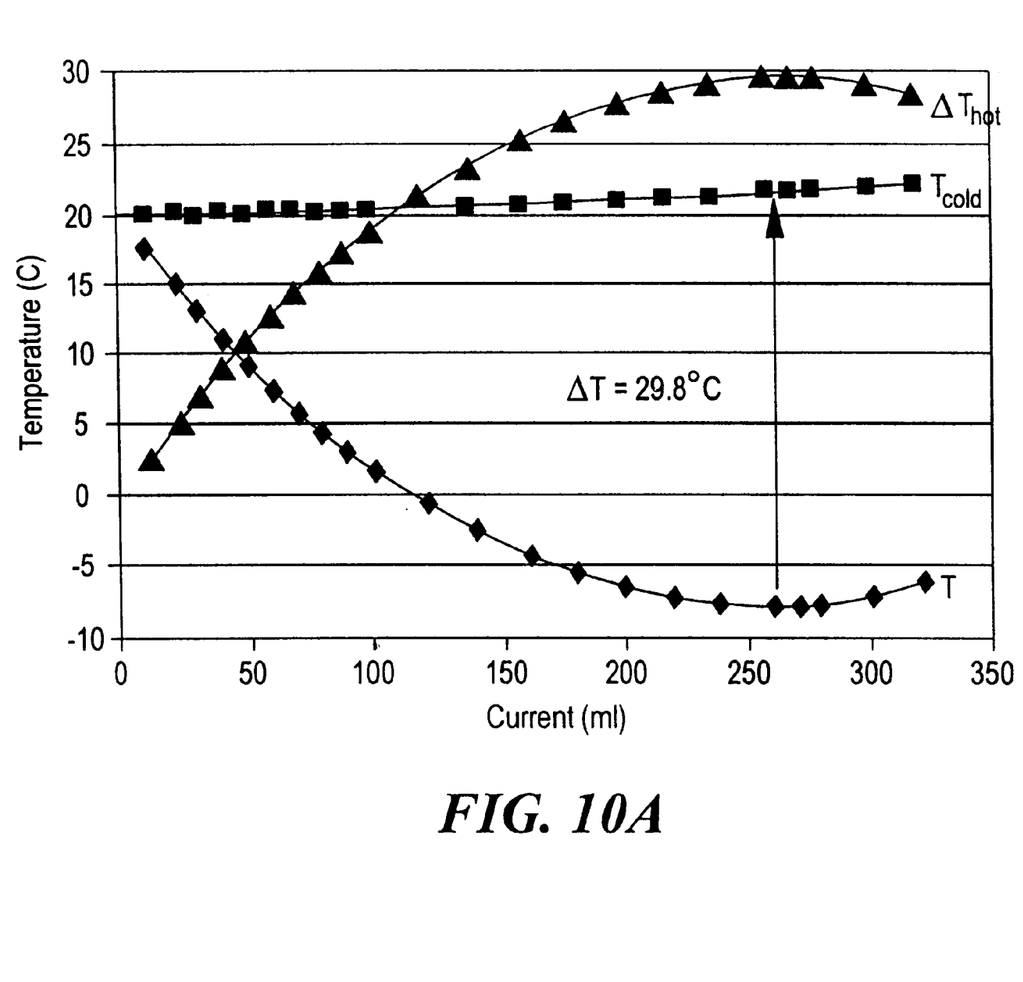
FIG. 10A is a plot of Temperature versus Current for the first quantum dot superlattice device.

Referring now to FIG. 10A a plot of temperature versus current for a first bulk device made from the quantun-dot material is shown. The plot shows maximum $\Delta T$ of 29.8 C at approximately 261 mA. The power required for this maximum $\Delta T$ is 35 mW.

Figure 10B:
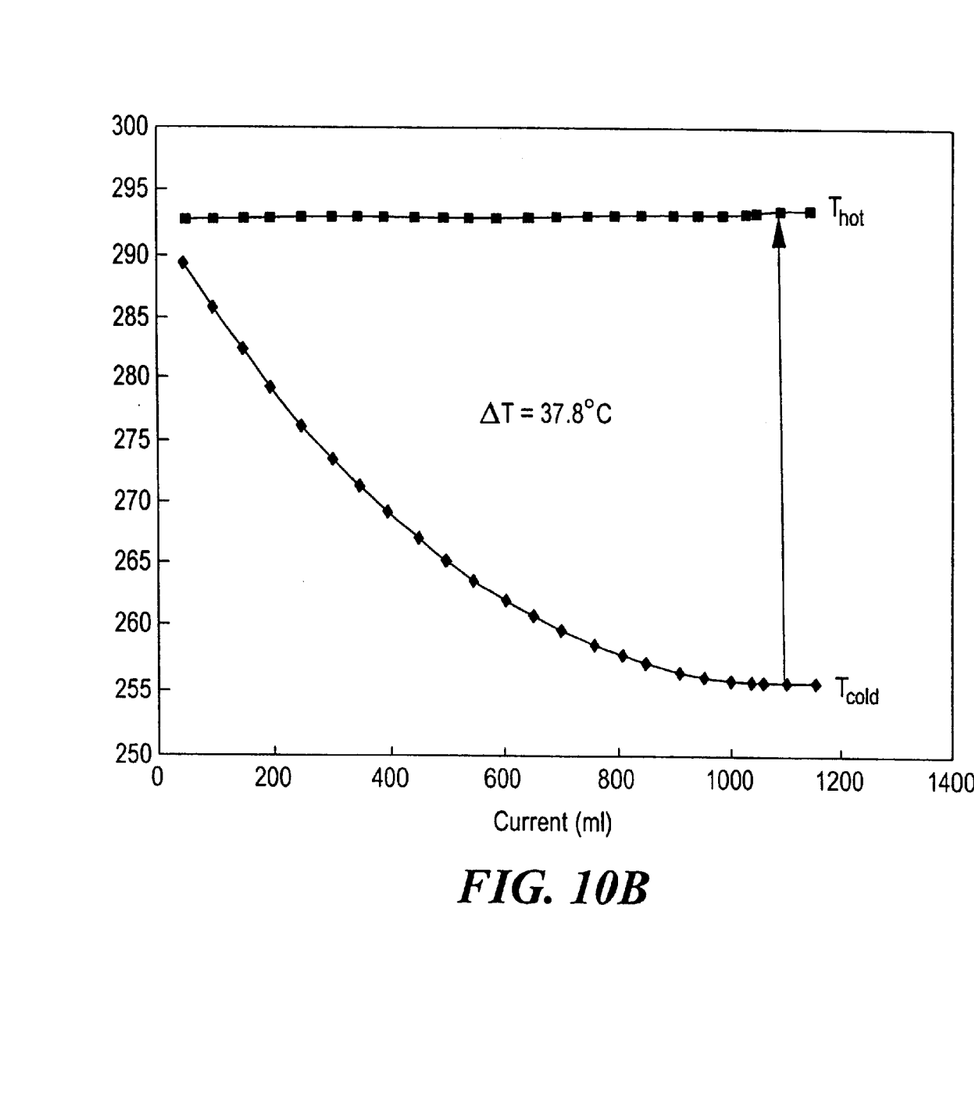
FIG. 10B is a plot of Temperature versus Current for a second quantum dot superlattice device.

Referring now to FIG. 10B, a plot of a second quantum-dot bulk device is shown. This device was made by using two quantum dot chips placed in a side-by-side arrangement. This side-by-side arrangement was chosen to more nearly match the n-type and p-type sample geometries. This multichip device exhibited a maximum $\Delta T$ of 37.8 K at approximately 1100 mA. This is an approximately eight degree increase in cooling as compared to the single chip device described above, despite an increase in radiation loss.

Another device was made using two quantum-dot chips stacked one on top the other. This device exhibited an even greater $\Delta T$ than the two devices described above. This device exhibited a $\Delta T$ maximum of 43 C at approximately 1400 mA. The cooling achieved by these devices was accomplished without the use of fans, flowing water, cooled radiation shields or cooled thermocouple wires.

Having described preferred embodiments of the invention, it will now become apparent to one of ordinary skill in the art that other embodiments incorporating their concepts may also be used. It is felt therefore that these embodiments should not be limited to disclosed embodiments but rather should be limited only by the spirit and scope of the appended claims.

All publications and references cited herein are expressly incorporated herein by reference in their entirety.

What is claimed is:

1. A multi-element quantum dot superlattice device comprising:

a first quantum dot superlattice element; and a second quantum dot superlattice element, said second quantum dot superlattice element directly bonded to said first quantum dot suprelattice element in a predetermined physical orientation selected to match sample geometries of said first and second quantum dot superlattice elements and to reduce a radiation loss factor of said device, said second quantum dot superlattice element in thermal communication with said first quantum dot superlattice element.

2. The multi-element quantum dot superlattice device of claim 1 wherein said pre-determined abutting physical orientation comprises an orientation wherein said second quantum dot superlattice element is disposed adjacent to and in physical contact with said first quantum dot superlattice structure.

3. The multi-element quantum dot superlattice device of claim 1 wherein said pre-determined abutting physical orientation comprises an orientation wherein said second quantum dot superlattice structure is disposed directly above and in physical contact with said first quantum dot superlattice element.

4. The multi-element quantum dot superlattice device of claim 2 wherein said device provides a maximum temperature difference of approximately thirty-eight degrees Celsius.

5. The multi-element quantum dot superlattice device of claim 4 wherein said device provides said maximum temperature at approximately 1.1 amperes.

6. The multi-element quantum dot superlattice device of claim 3 wherein said device provides a maximum temperature difference of approximately forty-three degrees Celsius.

7. The multi-element quantum dot superlattice device of claim 4 wherein said device provides said maximum temperature at approximately 1.4 amperes.

* * * * *